United States Patent
Schumacher et al.

(10) Patent No.: US 7,434,141 B1
(45) Date of Patent: Oct. 7, 2008

(54) NETWORK-BASED MEMORY ERROR DECODING SYSTEM AND METHOD

(75) Inventors: Derek Steven Schumacher, Auburn, CA (US); Idis Ramona Martinez, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 463 days.

(21) Appl. No.: 10/880,005

(22) Filed: Jun. 28, 2004

(51) Int. Cl.
*H03M 13/00* (2006.01)
*G11C 29/00* (2006.01)

(52) U.S. Cl. .................................. 714/767; 714/773
(58) Field of Classification Search ................. 714/767, 714/773
See application file for complete search history.

(56) References Cited

U.S. PATENT DOCUMENTS

| | | | | |
|---|---|---|---|---|
| 4,473,878 A | * | 9/1984 | Zolnowsky et al. | 711/208 |
| 4,481,573 A | * | 11/1984 | Fukunaga et al. | 711/207 |
| 4,955,024 A | * | 9/1990 | Pfeiffer et al. | 714/763 |
| 5,862,206 A | * | 1/1999 | Thomas et al. | 370/395.4 |
| 6,052,803 A | * | 4/2000 | Bhatia et al. | 714/49 |
| 6,615,383 B1 | * | 9/2003 | Talluri et al. | 714/749 |

OTHER PUBLICATIONS

HP News Release, HP Unveils Scalable Chipset to Boost Performance, Bandwidth for HP's McKinley-based Systems HP Unveils Scalable Chipset to Boost Performance, Bandwidth for HP's McKinley-based Systems, Feb. 12, 2002, http://www.hp.com/hpinfo/newsroom/press/2002/020225c.html.*

* cited by examiner

*Primary Examiner*—Joseph D Torres

(57) ABSTRACT

A server computer system receives error data including a physical memory address along with configuration data associated with the physical memory address, and may also include error syndrome data. The server computer system includes a memory error decoder component that is operable to process the physical memory address and configuration data to generate a memory bus address corresponding to the physical memory address. The memory error decoder also processes the error syndrome data to generate the location of an erroneous bit within a group of data bits and all possible electrical routes of the erroneous data bit within a failing computer system. The server system outputs the memory bus address and the location and electrical route of the erroneous data bit.

11 Claims, 2 Drawing Sheets

NETWORK-BASED MEMORY ERROR DECODING SYSTEM AND METHOD

BACKGROUND OF THE INVENTION

A typical computer system includes a processor for executing software instructions to perform desired calculations or tasks, such as word processing, data entry and management via spreadsheets or a database, Internet access, and so on. The processor communicates with a variety of other components in the computer system to control the overall operation of the system. More specifically, the processor communicates with these other components through a chipset, which is a group of integrated circuits typically including several controllers that collectively allow the processor to access and control components in the computer system. For example, the processor accesses a memory subsystem through controllers in the chipset, and the same is true of accessing and retrieving data from mass storage devices like hard disks. For ease of description, in the following discussion the chipset will be referred to as a single component although the chipset may include one or more controllers and possibly other integrated circuits as well.

In a computer system, the processor stores data along with programming instructions for programs that are currently being executed in dynamic random access memory (DRAM) in the memory subsystem. The term data is used to include any type of information stored in memory, and thus includes data being operated on or generated by a program as well as programming instructions. Any errors in data written into DRAM and data read from DRAM may adversely affect the operation of the computer system or the results generated by a particular program being executed. Such memory errors are particularly problematic in computer systems that must be available around the clock, such as a Web server that delivers Web pages to client computer systems requesting such pages. A Web server must be operational around the clock in a commercial environment where the server contains Web pages that collectively form a company's commercial Web site. The Web site may be accessed by customers any time of day and thus any memory errors that necessitate making the server and thus the Web site unavailable may be extremely costly and must be quickly diagnosed to minimize server/site downtime, and avoided altogether if possible.

The chipset typically includes error correcting code (ECC) circuitry that detects and corrects certain types of memory errors. When the chipset detects any such memory errors, the chipset typically stores information related to the detected error in special error registers in the chipset. For example, the Hewlett-Packard zx1 chipset stores memory error data in three registers: 1) an address register that stores a physical memory address of the data containing the error; 2) a first syndrome register that stores error syndrome data regarding the detected error; and 3) a second syndrome register that also stores error syndrome data regarding the detected error. The physical memory address is the address supplied by the processor to the chipset to access corresponding data in the memory, and the error syndrome data indicates the location of the erroneous bit or bits in the data corresponding to the physical memory address.

An error diagnostic program running on the server typically retrieves the error data stored in these registers in the chipset and reports the detected errors to an administrator responsible for maintaining the server. The administrator then typically manually decodes the detected memory errors utilizing the error data to determine the precise location of the error within the memory. The administrator must do this because the physical memory address stored in the address register does not indicate the specific defective component in the memory, but merely an address that corresponds to some unknown physical components. More specifically, the memory subsystem includes a plurality of DRAM memory modules each including a plurality of individual DRAM devices. To access data in the memory, the chipset must map or translate the physical memory address from the processor into a memory bus address understood by the DRAM devices. Configuration registers in the chipset contain information regarding the specific types of DRAM modules and devices coupled to the chipset, and the chipset utilizes this configuration data to translate the physical memory addresses into corresponding memory bus addresses. The memory bus address includes rank, bank, row, and column components generated by the chipset in response to the applied physical memory address. A rank corresponds to DRAM devices coupled to a common chip select signal, where the chip select signal is a signal that must be activated to access the device. The bank, row, and column components correspond to particular data within each DRAM device in the rank being accessed, with the data being organized in individual banks containing a plurality of rows and columns of memory cells that physically store the data.

Although the chipset must translate a physical memory address to a memory bus address to access data in the DRAM memory, in many chipsets, like the Hewlett-Packard zx1 chipset, only the physical memory address is stored in the error registers. As a result, the system administrator must manually translate the physical memory address into the memory bus address and analyze the error syndrome data to identify the precise module, device, and memory cells within the device that correspond to the erroneous data. This is a time consuming and thus expensive process. While the administrator could write a custom program to automatically perform this translation, individuals other than the administrator whom wrote the program may not know about the program or may not know how to use the program due to lack of documentation. Similarly, if the configuration of the memory changes then the custom program must also be updated to provide accurate results. Duplication of effort may also result if multiple servers contain identical memory configurations.

There is a need for a system and method for decoding detected memory errors in computer systems that eliminates the need to manually decode such errors while also being easily kept current to account for evolving memory subsystem designs and which is accessible by numerous administrators to eliminate duplication of effort.

SUMMARY OF THE INVENTION

According to one aspect of the present invention, a server computer system receives error data that includes a physical memory address along with configuration data associated with the physical memory address, as well as error syndrome data. The server computer system includes a memory error decoder component that is operable to process the physical memory address and configuration data to generate a memory bus address corresponding to the physical memory address and to output this memory bus address. The memory error decoder component may also be operable to process the error syndrome data to generate the location of an erroneous bit within a group of data bits and all possible electrical routes of the erroneous data bit within a failing computer system, and to output the electrical route of the erroneous data bit.

DETAILED DESCRIPTION OF PREFERRED EMBODIMENTS

Figure 1:
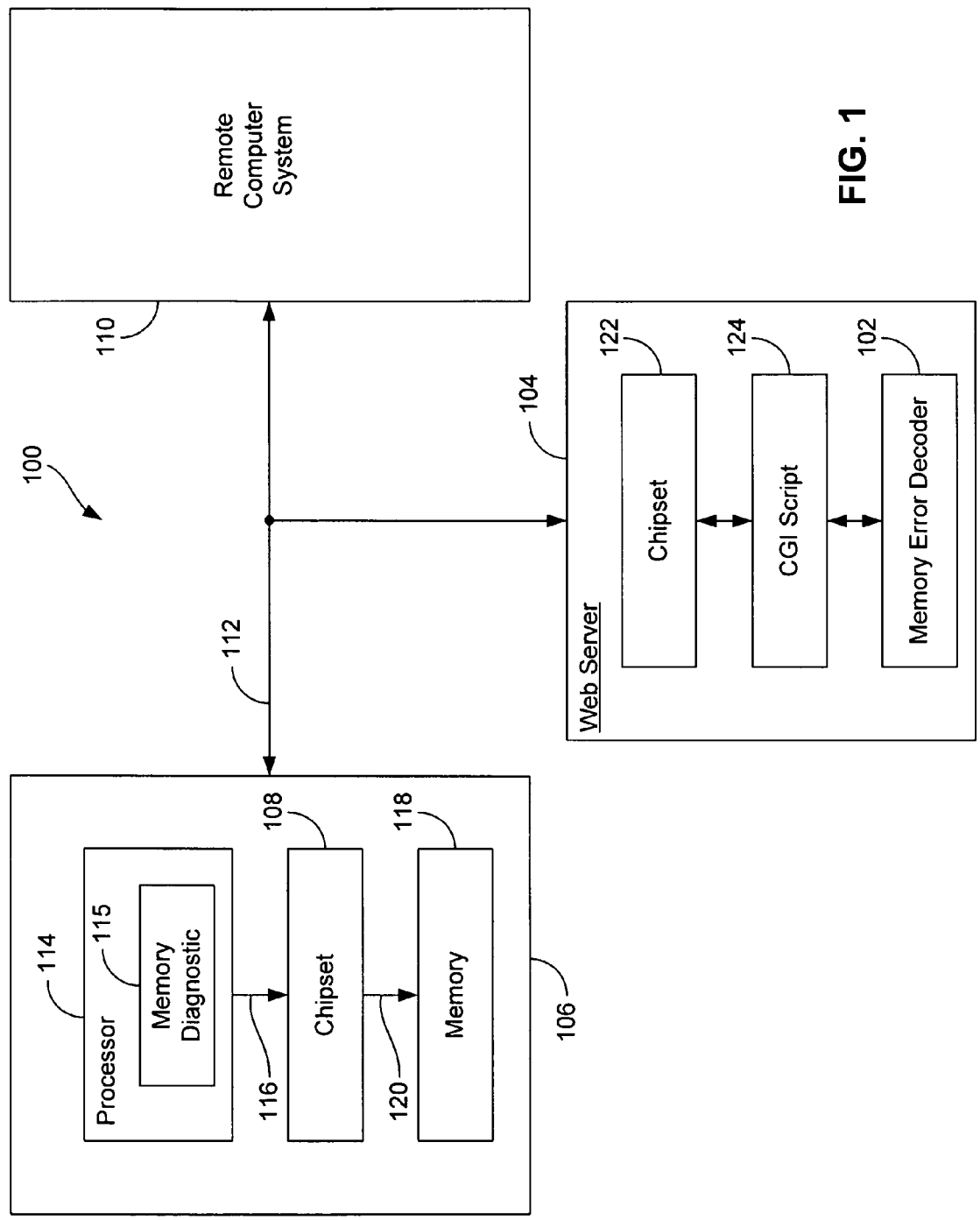
FIG. 1 is a functional block diagram of a computer network including a network-based memory error decoder according to one embodiment of the present invention.

FIG. 1 is a functional block diagram of a computer network 100 including a network-based memory error decoder 102 executing on a Web server 104 which enables a system administrator to easily decode detected memory errors in a computer system 106, as will be explained in more detail below. By implementing the memory error decoder 102 on the Web server 104, an administrator or other personnel may decode detected memory errors in the computer system 106 simply by utilizing a remote computer system 110 to retrieve error data stored in a chipset 108 in the computer system, and thereafter communicating this error data to the memory error decoder 102 on the Web server. Once the administrator supplies the error data to the memory decoder 102, the administrator initiates execution of the decoders to generate physical memory address and data error information, which the Web server 104 then supplies back to the remote computer system 110. In this way, the network-based memory error decoder 102 eliminates the need for the administrator to manually decode memory errors. Moreover, the memory error decoder 102 also provides a central location that enables a single person or group to develop and maintain all required memory error decoders for the computer system 106 and for other computer systems (not shown) both inside and outside the network 100. This eliminates duplication of effort for similarly configured systems and also better enables the memory error decoder 102 to be kept current as changes occur in the memory subsystem designs of the computer system 106 and other computer systems.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

In the computer network 100, the Web server 104, computer system 106, and remote computer system 110 communicate over a suitable communications link 112, which may include the Internet. The computer system 106 includes a processor 114 that executes desired programs including a memory diagnostics program 115 that occasionally executes to test a memory subsystem 118 of the system 106. The processor 114 supplies physical memory addresses 116 to the chipset 108 during execution of programs in order to access data stored in the memory subsystem 118, which typically includes DRAM modules as previously discussed. In response to the physical memory address 116 from the processor 114, the chipset 108 translates the physical memory address into a corresponding memory bus address 120 and applies the memory bus address to the DRAM modules in the memory subsystem 118 to write data to or read data from corresponding memory locations.

The memory bus address 120 includes appropriate components to access the DRAM modules in the memory subsystem 118, and is typically viewed as including bank, row, and column components. The memory bus address 120 is not typically viewed as including the rank being accessed, with the rank instead normally being viewed as part of a command (e.g., read, write, active, etc.) applied by the chipset 108 to the DRAM modules along with the memory bus address. As used herein, however, the term memory bus address is used broadly to include any components that may be considered address components required to access particular locations in the memory subsystem 118. Thus, for example, perhaps in some memory subsystems 118 the memory bus address may include only row and column addresses.

The Web server 104 includes a front-end interface 122 that communicates with the remote computer system 110 and any other computer systems (not shown) coupled to the network 100 that access the Web server. In operation, the front-end interface 122 provides a Web page over the communications link 112 to the remote computer system 110 in response to a request from a browser or other suitable program (not shown) running on the remote computer system. The Web page displayed on the remote computer system 110 contains fields that allow a system administrator or other user to enter error data to be decoded by the memory error decoder 102 along with configuration data that the memory error decoders utilize to decode the error data. The Web page also includes buttons or other suitable inputs that allow an administrator to select particular components (not shown in FIG. 1) in the memory error decoder 102 that are to be executed. Each component in the decoder 102 performs a particular function, such as address decoding or error syndrome decoding as will be explained in more detail below. Recall, in one embodiment the chipset 108 is the zx1 chipset and the error data includes physical memory address and error syndrome data as previously discussed. Once the administrator enters the error and configuration data and selects the desired components in the decoder 102, he or she clicks a button on the Web page, such as a "decode" or "send" button, and this data is communicated over the communications link 112 to the front-end interface 122 on the Web server 104. In another embodiment, the user invokes a script or other suitable program on the remoter computer system 110, and this script communicates with the computer system 106 to automatically obtain the required error and configuration data.

Upon receiving the data from the remote computer system 110, the front-end interface 122 provides the data to a common gateway interface (CGI) script 124 which processes the data to place it in a form suitable for input to the memory error decoder 102. In this way, the CGI script 124 operates as an interface between the front-end interface 122 and the memory error decoder 102. In response to the received data, the CGI script 124 determines which component or components in the memory error decoder 102 is/are to be executed, with each component being executable to provide more detailed information regarding the precise location of the memory error. More specifically, if an address component in the memory error decoder 102 is selected, the decoders decode the physical memory address component of the error data to generate a corresponding memory bus address, which indicates the rank, bank, row, and column components corresponding to the physical memory address.

When a data component in the memory error decoder 102 is selected, the decoders decode the error syndrome data to determine possible electrical routes of an erroneous bit in the data corresponding to the memory bus address. These electrical routes map the path or paths (there may be more than one possible path in some implementations) of the erroneous bit between the chipset 108 and a DRAM component within the memory subsystem 118 to allow for accurate isolation of the error being decoded. The data component identifies the location of an erroneous bit to be identified where a group of bits or word is associated with the memory bus address, and maps the erroneous bit to possible electrical routes within the computer system 106. For example, the memory bus address may correspond to 64 bits of data where each data word is 64 bits wide. In this situation the memory error decoder 102 decodes the error syndrome data to determine which one of these 64 bits is erroneous. The memory error decoder 102 then utilizes a data map component (not shown in FIG. 1) for the computer system 106 to determine the possible electrical routes of the erroneous bit within the computer system. The memory error decoder 102 may also perform additional functions, such as formatting the decoded address and error bit data to present the data in a format that may be easily understood by the system administrator. Recall, the administrator may select the desired tools or components in the memory error decoder 102 that are to be invoked or executed in a particular situation, and thus may, for example, decide only to execute the address or data component of the memory error decoder in some situations. However, the most precise and comprehensive decoding occurs when both the address and data components of the memory error decoder 102 are selected and executed together via a parent component of the memory error decoder, which will be described in more detail below.

Once the selected component or components in the memory error decoder 102 have generated the corresponding data, the CGI script 124 processes this data and places it in format suitable for the front-end interface 122 which, in turn, places the data in a Web page that is then communicated over the link 112 to the remote computer system 110. This Web page is displayed on the remote computer system 110 to provide the system administrator with the decoded data. The system administrator may then use this information to replace a defective memory module in the computer system 106 and may provide the information to a manufacturer of the memory module to enable the manufacturer to troubleshoot the defect. The computer system 106 may, for example, be a server containing a large number of DRAM memory modules. The memory error decoder 102 allows a system administrator to quickly and reliably determine the precise location of such memory errors and to take steps to eliminate such errors by replacing defective components.

The memory error decoder 102 is network-based in that the decoder is accessible by any computer system coupled to the network 100. This enables a system administrator to remotely decode detected memory errors in the computer system 106 simply by utilizing the remote computer system 110 to retrieve error and configuration data stored in a chipset 108 in the computer system, and thereafter providing this data to the memory error decoder 102 on the Web server 104. The administrator no longer needs to manually decode the error data from the chipset 108, and neither does he have to write a custom program to perform this decoding. Also, making the memory error decoder 102 accessible via the Web server 104 allows a single instance of the decoders to be developed and maintained while providing access to any personnel having access to the network 100. This eliminates duplication of effort for similarly configured systems and also better enables the memory error decoder 102 to be kept current as changes occur in the memory configurations of the computer system 106 and other computer systems in the network 100. In one embodiment, the chipset 108 is the Hewlett-Packard zx1 chipset and thus includes the three error registers previously described for storing the physical memory address 116 along with error syndrome data for any memory errors detected during execution of the memory diagnostics program 115, and also includes configuration registers that store the configuration data.

Figure 2:
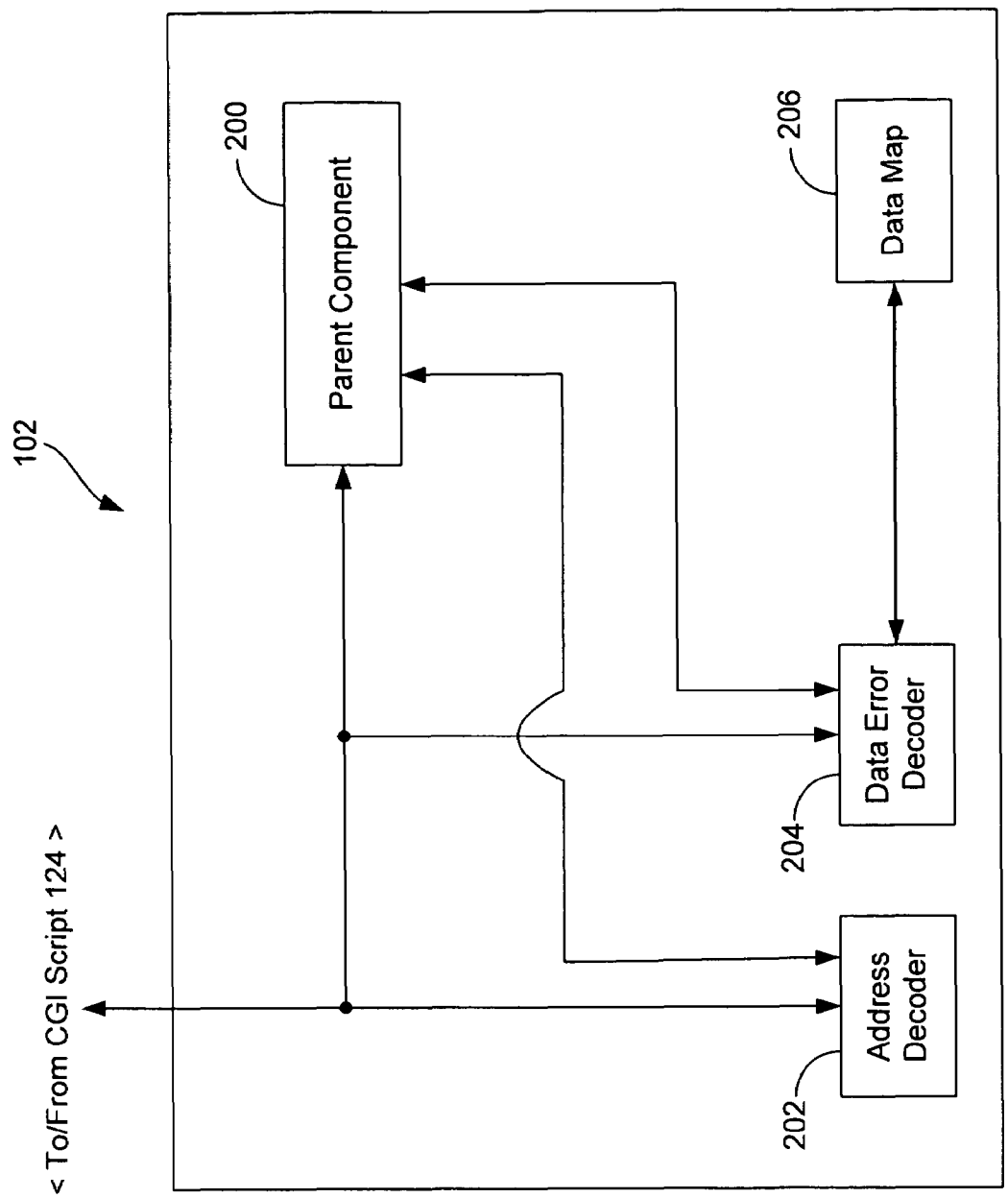
FIG. 2 is a functional block diagram showing the memory error decoder of FIG. 1 in more detail according to one embodiment of the present invention.

FIG. 2 is a functional block diagram showing the memory error decoder 102 of FIG. 1 in more detail according to one embodiment of the present invention. In this embodiment, the memory error decoder 102 receives the error and configuration data from the CGI script 124 (FIG. 1). In response to user input from the front-end interface 122 (FIG. 1), the CGI script 124 (FIG. 1) activates or calls either an address decoder component 202, a data error decoder component 204, or a parent component 200. If the user input indicates that full decoding is to be performed, the CGI script 124 calls the parent component 200 which, in turn, calls both the address and data decoder components 202, 204. The address decoder component 202 receives the physical memory address and configuration data from the CGI script 124 (FIG. 1) or the parent component 200 and translates the physical memory address into a corresponding memory bus address. The data error decoder component 204 receives the error syndrome data from the CGI script 124 (FIG. 1) or the parent component 200 and determines all possible electrical routes of an erroneous bit from this error syndrome data. In one embodiment, the data error decoder component 204 utilizes an accompanying data map component 206 for the computer system 106 (FIG. 1). The data map component 206 contains all possible error syndromes, each syndrome indicating a particular erroneous bit in a group of data bits and all possible electrical routes within the computer system 106 associated with the memory bus address. The data map component 206 includes mapping information for any computer system 106 (FIG. 1) that is to be supported by the data error decoders 204.

Utilization of a data map component 206 separate from the data error decoders 204 allows for easier portability of the scripts forming the data error decoders. This makes maintaining data error decoders 204 relatively easy, requiring low overhead with most of the work it takes to support a new computer system 106 involving the creation of a corresponding data map file for inclusion in the data map component 206. This can typically be done by designers themselves once they learn a bit about what needs to be included in the data map file. In another embodiment, the data map component 206 corresponds to a look-up table containing all possible error syndromes.

The data from the address and data error decoder components 202, 204 is provided to the CGI script 124 (FIG. 1) if called individually or to the parent component 200 if both are called, each of which then parses and formats the data it receives to enable the system administrator to quickly and easily determine where the problem exists within the memory subsystem 118 on the computer system 106. Note that in one embodiment, the parent component 200 performs parsing and formatting of the data from the decoders 202, 204 only when this feature has been selected by the system administrator via the Web page displayed on the remote computer system 110.

This functionality of the parent component 200 is thus one of the components that may be selected by the administrator via the Web page supplied to the remote computer system 110 as previously discussed.

Even though various embodiments and advantages of the present invention have been set forth in the foregoing description, the above disclosure is illustrative only, and changes may be made in detail and yet remain within the broad principles of the present invention. For example, the functions performed by components 102-124 may be combined to be performed by fewer elements, separated and performed by more elements, or combined into different functional blocks depending upon the structure and functionality of the network 100. Therefore, the present invention is to be limited only by the appended claims.

What is claimed is:

1. A computer network, comprising:
   a first computer system containing a memory system including a chipset and at least one memory module, the chipset operable to receive a physical memory address and to translate the physical memory address into a corresponding memory bus address according to configuration data stored in the chipset, and the chipset further operable to detect erroneous data stored in the memory system and to store a physical memory address and error data associated with the erroneous data;
   a second computer system coupled to the first computer system through a communications link to receive the physical memory address, error data, and configuration data stored in the chipset, and operable to output the physical memory address, error data, and configuration data over the communication link; and
   a server computer system coupled to the second computer system through the communications link to receive the physical memory address, error data, and configuration data from the second computer system, the server computer system including a memory error decoder component that is operable to process the physical memory address and configuration data to generate a memory bus address corresponding to the physical memory address, and is operable to process the error data to generate possible electrical routes of an erroneous data bit within a group of data bits associated with the memory bus address, the server system being further operable to communicate the data indicating the memory bus address and possible electrical routes to the second computer system over the communications link.

2. The computer network of claim 1 wherein the chipset comprises an HP zx1 chipset.

3. The computer network of claim 1 wherein the error data includes error syndrome data.

4. The computer network of claim 1 wherein the memory error decoder component comprises:
   an address decoder component operable to generate the memory bus address from the physical memory address and configuration data;
   a data decoder component operable to determine from the error syndrome data the location of the erroneous data bit within a group of data bits and all possible electrical routes of the erroneous data bit associated with the memory bus address; and
   a parent component coupled to the address and data decoder components, the parent component operable to activate the address and data decoders responsive to selection data, and to receive data from these activated components and output the received data.

5. The computer network of claim 4 wherein the data decoder component further includes a data map component containing all possible error syndromes, each syndrome indicating a particular erroneous bit in a group of data bits and all possible electrical routes of the erroneous data bit associated with the memory bus address, and wherein the data decoder component utilizes the data map component in determining the location of the erroneous data bit.

6. The computer network of claim 1 wherein the server computer system further includes a front-end interface component that is operable to provide a Web page including fields adapted to receive error data and is further operable to receive the error data entered into the Web page.

7. A method of translating error data including a physical memory address indicating a location of an erroneous data bit into a corresponding memory bus address, the method comprising:
   obtaining the physical memory address and configuration data from a chipset in which the physical memory address and configuration data are stored, the chipset being contained in a first computer system;
   providing the obtained physical memory address and configuration data over a computer network to a second computer system;
   providing the physical memory address and configuration data from the second computer system to a third computer system over a computer network;
   translating the physical memory address into a corresponding memory bus address using the configuration data on the third computer system; and
   providing the memory bus address to the second computer system.

8. The method of claim 7 wherein the memory bus address corresponds to a DRAM address including at least rank, bank, and row address components.

9. The method of claim 7 wherein the error data further includes error syndrome data and wherein the method further comprises decoding the error syndrome data utilizing a data map containing the possible electrical routes of an erroneous bit.

10. The method of claim 7 wherein the operations of providing comprise communicating the associated data over a suitable communications link.

11. The method of claim 7 wherein obtaining comprises invoking a script to automatically obtain the required error and configuration.

* * * * *